(12) United States Patent
Uchida

(10) Patent No.: US 11,619,765 B2
(45) Date of Patent: Apr. 4, 2023

(54) OPTICAL ELEMENT AND METHOD OF PRODUCING OPTICAL ELEMENT

(71) Applicant: ARKRAY, Inc., Kyoto (JP)

(72) Inventor: Hirohisa Uchida, Kyoto (JP)

(73) Assignee: ARKRAY, Inc., Kyoto (JP)

( * ) Notice: Subject to any disclaimer, the term of this patent is extended or adjusted under 35 U.S.C. 154(b) by 427 days.

(21) Appl. No.: 16/542,961

(22) Filed: Aug. 16, 2019

(65) Prior Publication Data
US 2020/0073018 A1    Mar. 5, 2020

(30) Foreign Application Priority Data

Sep. 4, 2018 (JP) .............................. JP2018-165331

(51) Int. Cl.
| | | |
|---|---|---|
| *G02B 1/111* | (2015.01) | |
| *C30B 29/54* | (2006.01) | |
| *G02F 1/35* | (2006.01) | |
| *G02F 1/355* | (2006.01) | |

(52) U.S. Cl.
CPC .............. *G02B 1/111* (2013.01); *C30B 29/54* (2013.01); *G02F 1/3505* (2021.01); *G02F 1/3551* (2013.01)

(58) Field of Classification Search
CPC ............................ G02B 1/111; G02F 1/3551
See application file for complete search history.

(56) References Cited

U.S. PATENT DOCUMENTS

| 6,406,647 B1 * | 6/2002 | Thakur ..................... C30B 7/00 117/70 |
|---|---|---|
| 2004/0030998 A1 | 2/2004 | Takamori et al. |
| 2007/0141357 A1 | 6/2007 | Bekiarian et al. |
| 2017/0052285 A1 | 2/2017 | Zabeida et al. |

FOREIGN PATENT DOCUMENTS

| CN | 101331409 A | 12/2008 |
|---|---|---|
| EP | 1726974 A2 | 11/2006 |
| JP | H02-254426 A | 10/1990 |
| JP | H05-289126 A | 11/1993 |
| JP | H05-313216 A | 11/1993 |
| JP | H07-244308 A | 9/1995 |
| JP | 2004-109457 A | 4/2004 |
| JP | 2004-219967 A | 8/2004 |

OTHER PUBLICATIONS

Crawford et al. "An antireflective coating suitable for use on polymer optics". Proc. SPIE 7095, Nanophotonics and Macrophotonics for Space Environments II, (Aug. 26, 2008); pp. 709505-1 to 709505-11.*

"CYTOP Amorphous Fluoropolymer Technical Brochure". AGC Inc. Chemicals Company, (Jul. 2018); pp. 1-18.*

(Continued)

*Primary Examiner* — Prashant J Khatri
(74) *Attorney, Agent, or Firm* — Studebaker & Brackett PC

(57) ABSTRACT

An optical element includes an optical crystal and an antireflection film coating the surface of the optical crystal. The antireflection film contains an organic compound that includes, as a structural unit, at least one of a compound containing a cyclic structure to which a fluorine atom is bound and a compound containing a cyclic olefin structure.

10 Claims, 8 Drawing Sheets

(56) References Cited

OTHER PUBLICATIONS

"Material Properties of Teflon—Polytetrafluoroethylene (PTFE)", Dielectric Manufacturing. Retrieved Jan. 10, 2022.*

The extended European search report issued by the European Patent Office dated Jan. 24, 2020, which corresponds to European Patent Application No. 19193198.9-1020 and is related to U.S. Appl. No. 16/542,961.

Kagawa et al.; "Antireflection coating with fluoropolymer for a novel organic nonlinear optical crystal: 8-(4'-acetylphenyl)-1, 4-dioxa-8-azaspiro[4.5] decane (ADPA)"; Applied Optics; Jun. 20, 1995; pp. 3421-3424; vol. 34 No. 18; The Optical Society of America.

Vicario et al.; "Laser driven generation of intense single-cycle THz field"; Feb. 2012; pp. 82610Z-1-82610Z-7; vol. 8261; Proceedings of SPIE.

An Office Action mailed by China National Intellectual Property Administration dated Feb. 16, 2022, which corresponds to Chinese Patent Application No. 201910793744.6 and is related to U.S. Appl. No. 16/542,961; with English language translation.

Communication pursuant to Article 94(3) EPC issued by the European Patent Office dated Mar. 24, 2022, which corresponds to European Patent Application No. 19193198.9-1020 and is related to U.S. Appl. No. 16/542,961.

An Office Action; "Notice of Reasons for Refusal," mailed by the Japanese Patent Office dated May 31, 2022, which corresponds to Japanese Patent Application No. 2018-165331 and is related to U.S. Appl. No. 16/542,961; with English language translation.

* cited by examiner

OPTICAL ELEMENT AND METHOD OF PRODUCING OPTICAL ELEMENT

CROSS-REFERENCE TO RELATED APPLICATION

This application claims priority under 35 USC 119 from Japanese Patent Application No. 2018-165331, the disclosure of which is incorporated by reference herein.

All publications, patent applications, and technical standards mentioned in this specification are herein incorporated by reference to the same extent as if each individual publication, patent application, or technical standard was specifically and individually indicated to be incorporated by reference.

BACKGROUND

Technical Field

The present invention relates to an optical element and a method of producing the optical element.

Related Art

Conventionally, when a thin film such as an antireflection film or a high-reflection film is formed on a surface of an optical element, a dielectric material containing, as a component, an inorganic compound such as $TiO_2$, $Ta_2O_5$, $Al_2O_3$, $SiO_2$, or $MgF_2$ has been used. For example, in the case of using an organic nonlinear optical crystal, a film of a dielectric material which is an inorganic compound as described above is formed on the crystal by vacuum vapor deposition, to be used as an antireflection film see, for example, Patent Documents 1 to 3). Further, there is also a case in which an antireflection film is formed at an end surface on which light, such as a laser beam, is made incident, for the purpose of isolating between an optical element and an air layer (see, for example, Patent Document 4).

RELATED ART DOCUMENTS

Patent Documents

Patent Document 1: Japanese Patent Application Laid-Open (JP-A) No. H05-313216
Patent Document 2: JP-A No. H07-244308
Patent Document 3: JP-A No. 2004-109457
Patent Document 4: JP-A No. H02-254426

SUMMARY OF THE INVENTION

Technical Problem

However, in a case in which film formation is carried out on the surface of an optical crystal, using a dielectric material which is an inorganic compound as described above, there is a problem that cracks are more likely to occur in the resulting thin film of the dielectric material. The occurrence of cracks in the thin film may possibly result in a deterioration of optical performance of the resulting antireflection film, high-reflection film, or the like, or in a failure to isolate between the optical element and an air layer.

One embodiment of the invention has been done in view of the above described problem, and an object of the invention is to provide an optical element including a coating film in which the occurrence of cracks is prevented, and a method of producing the same.

Solution to Problem

<1> An optical element comprising:
an optical crystal; and
an antireflection film coating a surface of the optical crystal;
wherein the antireflection film contains an organic compound.

<2> The optical element according to <1>, wherein an absolute value of a difference in linear expansion coefficient between the antireflection film and the optical crystal is 130 ppm/K or less.

<3> The optical element according to <1> or <2>, wherein xe antireflection film has a Young's modulus at 25° C. of 10 GPa or less.

<4> The optical element according to any one of <1> to <3>, wherein the organic compound contains, as a structural unit, at least one compound selected from the group consisting of: a compound containing a cyclic structure to which a fluorine atom is bound; and a compound containing a cyclic olefin structure.

<5> The optical element according to any one of <1> to <4>, wherein the optical crystal is an organic optical crystal.

<6> The optical element according to <5>, wherein the organic optical crystal is an organic nonlinear optical crystal.

<7> The optical element according to <6>, wherein the organic nonlinear optical crystal is a DAST (4-dimethylamino-N-methyl-4-stilbazolium tosylate) crystal, a DASC (4-dimethylamino-N-methyl-4-stilbazolium-p-chlorobenzene sulfonate) crystal, a DSTMS (4-N,N-dimethylamino-4'-N'-methylstilbazolium-2,4,6-trimethylbenzenesulfonate) crystal, an OHI (2-(3-(4-hydroxystyryl)-5, 5-ditnethylcyclohex-2-enylidene)malononitrile) crystal, a BDAS-TP (bis(4-ditnethylamino-N-methyl-4-stilbazolium)terephthalate) crystal, a DAS-HTP (4-dimethylamino-N-methyl-4-stilbazolium hydrogen terephthalate) crystal, a BNA (N-benzyl2-methyl-4-nitroaniline) crystal, an HMQ-TMS ((2-(4-hydroxy-3-methoxystyryl)-1-methylquinolinium-2,4,6-trimethylbenzenesulfonate) crystal, or an MC-PTS (merocyanine-p-toluenesulfonic acid) crystal.

<8> The optical element according to any one of <1> to <7>, wherein the antireflection film has a refractive index of from 1.3 to 2.0 in at least a part of a wavelength range of from 1,000 nm to 2,000 nm.

<9> The optical element according to any one of <1> to <8>, wherein the antireflection film has a refractive index of from 1.3 to 2.0 in at least a part of a frequency range of from 0.3 THz to 30 THz.

<10> A method of producing the optical element according to any one of <1> to <9>, wherein the method comprises a step of forming the antireflection film on the surface of the optical crystal, by a wet process.

<11> The method of producing the optical element, according to <10>, wherein, in the step of forming the antireflection film by the wet process, the antireflection film is formed on the surface of the optical crystal, by dipping the optical crystal in a liquid containing a material for forming the antireflection film, and pulling up the dipped optical crystal from the liquid.

Advantageous Effects of Invention

The present disclosure is able to provide an optical element including a coating film in which the occurrence of cracks is prevented, and a method of producing the same.

DETAILED DESCRIPTION OF THE INVENTION

Figure 1A:
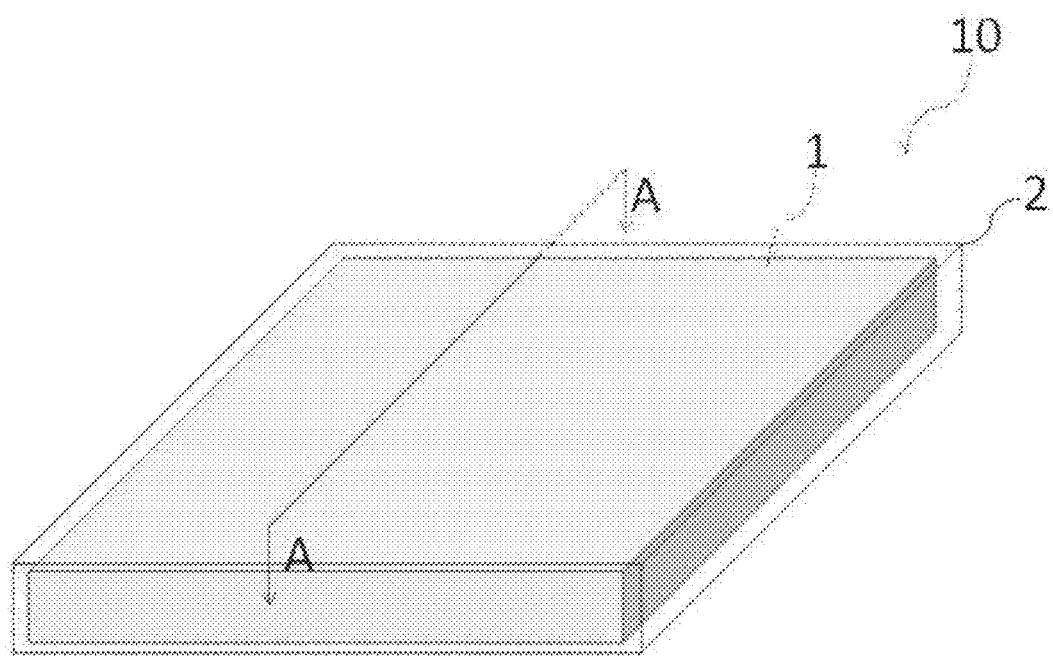
FIG. 1A is a schematic diagram showing an optical element in which the surfaces of an optical crystal are coated with a coating film containing an organic compound.

In the present disclosure, the definition of the term "step" includes not only an independent step which is distinguishable from another step, but also a step which is not clearly distinguishable from another step, as long as the object of the step can be achieved.

In the present disclosure, any numerical range indicated using an expression "from * to" represents a range in which numerical values described before and after the "to" are included in the range as a lower limit value and an upper limit value, respectively.

In a numerical range described in stages, in the present disclosure, the upper limit value or the lower limit value described in one numerical range may be replaced with the upper limit value or the lower limit value in another numerical range described in stages. Further, in a numerical range described in the present disclosure, the upper limit value or the lower limit value in the numerical range may be replaced with a value shown in Examples.

In a case in which an embodiment is described with reference to drawings, in the present disclosure, the configuration of the embodiment is not limited to any of the configurations shown in the drawings. Further, respective members in the respective drawings are shown in conceptual sizes, and relative relationships in size between the respective members are not limited to these sizes.

First Embodiment

<Optical Element>

First, an optical element according to a first embodiment will be described. The optical element according to the present embodiment includes: an optical crystal; and a coating film coating the surface of the optical crystal; wherein the coating film contains an organic compound. In the present embodiment, a coating film containing an organic compound is formed on the surface of the optical crystal, and this coating film exhibits a moderate viscoelasticity and thus has flexibility. By this arrangement, the coating film is less susceptible to rupture, and the occurrence of cracks in the coating film is prevented.

The coating film may be an antireflection film, a high-reflection film, or the like, and is preferably an antireflection film.

When an organic compound is used as a material for forming the coating film of the optical element, it is possible to form the coating film on the surface of the optical crystal, for example, by a wet process. In contrast, in a case in which an inorganic compound is used as a material for forming the coating film of the optical element, it is assumed that a vacumn vapor deposition technique is used for forming the coating film, in which case the film formation process requires a high temperature and vacuum processing. Accordingly, in the present embodiment, it is possible to simplify an apparatus for film formation and to reduce production cost, as compared to the case of using an inorganic compound as a material for forming the coating film.

Examples of the organic compound include polymers such as polymer materials and low-molecular weight resins. More specific examples include synthetic resins, plastics and rubbers. The organic compound is preferably a material containing a cyclic structure within a molecular structure, and more preferably a material containing, as a structural unit, at least one compound selected from the group consisting of: a compound containing a cyclic structure to which a fluorine atom is bound; and a compound containing a cyclic olefin structure.

Further, the organic compound may have a linear expansion coefficient of 100 ppm/K or less, from 10 ppm/K to 100 ppm/K, or from 50 ppm/K to 100 ppm/K, from the viewpoint of reducing the difference in linear expansion coefficient between the organic compound and the optical crystal, and thereby suitably preventing the occurrence of cracks, The organic compound may have a Young's modulus at 25° C. of 10 Gpa or less, 5 GPa or less, or 3 GPa or less, from the viewpoint of more suitably preventing the occurrence of cracks.

The coating film may consist of the organic compound, and preferably consists of a material containing, as a structural unit, at least one compound selected from the group consisting of: a compound containing a cyclic structure to which a fluorine atom is bound; and a compound containing a cyclic olefin structure, The optical crystal is preferably a crystal which, when an electromagnetic wave in the infrared to millimeter wave band is irradiated to the crystal, allows the electromagnetic wave to he frequency-converted into the visible light to millimeter wave band. The optical crystal may be an organic optical crystal, or an inorganic optical crystal. Further, the optical crystal may be a nonlinear optical crystal, and the nonlinear optical crystal may be, for example, an organic nonlinear optical crystal, an inorganic nonlinear optical crystal, or the like.

Examples of the organic nonlinear optical crystal include a DAST (4-dimethylamino-N-methyl-4-stilbazolium tosylate) crystal, a DASC (4-dimethylamino-N-methyl-4-stilbazolium-p-chlorobenzene sulfonate) crystal, a DSTMS (4-N, N-dimethylamino-4'-N'-methylstilbazolium-2,4,6-trimethylbenzenesulfonate) crystal, atr OH1 (2-(3-(4-hydroxystyryl)-5,5-dimethylcyclohex-2-enylidene)

malononitrile) crystal, a BDAS-TP (bis(4-dimethyla.mino-N-methyl-4-stilbazolium)terephthalate) crystal, a DAS-HTP (4-dimethylamino-N-methyl-4-stilbazolium hydrogen terephthalate) crystal, a BNA (N-benzyl2-methyl-4-nitroaniline) crystal, an HMQ-TMS ((2-(4-hydroxy-3-methoxystyryl)-1-methylquinolinium-2,4,6-trimethylbenzenesulfonate) crystal, and an MC-PTS (merocyanine-p-toluenesulfonic acid) crystal. Among these, the organic nonlinear optical crystal is preferably a DAST crystal, a DASC crystal, or an OH1 crystal. The DAST crystal has an "$n_a$", which is a refractive index along a-axis, of 2.13, and an "$n_b$", which is a refractive index along b-axis, of 1.60, at a wavelength of 1,550 nm.

Examples of the inorganic nonlinear optical crystal include $GaPO_4$ (gallium phosphate), GaAs (gallium arsenide), $LiNbO_3$ (lithium niobate), and KTP (potassium titanate phosphate).

A preferred thickness of the optical crystal may be from 1 μm to 100 mm, or from 100 μm to 2 mm. When the thickness of the optical crystal is not constant, the optical crystal is required to have a minimum thickness satisfying the above described numerical range.

In a case in which the optical element according to the present embodiment is used as a wavelength conversion element for converting the wavelength of an irradiated light, it is preferred that the coating film has a refractive index of from 1.3 to 2.0 in at least a part of a wavelength range of from 1,000 nm to 2,000 nm. Further, the coating film has a refractive index lower than the refractive index of the optical crystal.

Still further, the coating film more preferably has a refractive index of from 1.3 to 2.0 in at least one wavelength of 1,064 nm, 1,310 nm, 1,318 nm, 1,550 nm or 1,560 nm.

In a case in which the optical element according to the present embodiment is used as an electromagnetic wave detection element, it is preferred that the coating film has a refractive index of from 1.3 to 2.0 in at least a part of a frequency range of from 0.3 THz to 30 THz.

Further, the coating film preferably has a refractive index of from 1.3 to 2.0 in at least one frequency of 0.3 THz, 0.6 THz, 1.0 THz or 3.0 THz.

When the wavelength incident on the optical crystal is defined as λ (nm) and the refractive index of the coating film is defined as $n_1$, a film thickness (d) of the coating film is not particularly limited, and the coating film is preferably formed to have a film thickness (d) satisfying the equation: $d=\lambda/(4n_1)\times(2a-1)$ (wherein a represents an integer), or a film thickness close thereto. The film thickness (d) is preferably from 100 nm to 5 μm, more preferably from 200 nm to 3 μm, and particularly more preferably from 250 nm to 1 μm.

The film thickness of the coating film can be measured, for example, by spectroscopic ellipsometry.

Figure 1B:
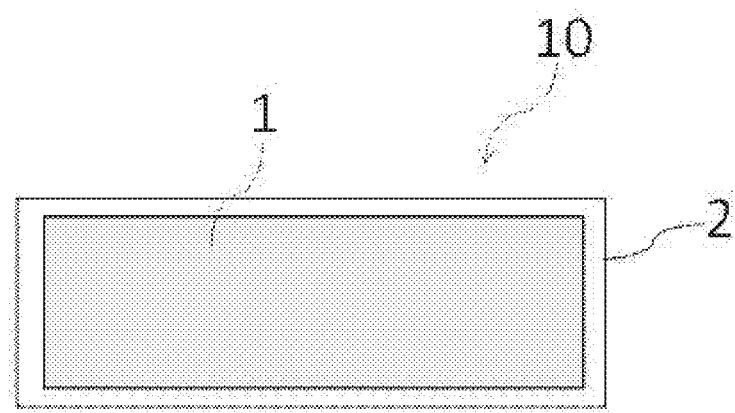
FIG. 1B is a sectional view of the optical element shown in FIG. 1A taken along a line A-A.

One example of the optical element according to the present embodiment will be now described, with reference to FIG. 1. FIG. 1A is a schematic diagram showing an optical element in which the surfaces of an optical crystal are coated with a coating film containing an organic compound; and FIG. 1B is a sectional view of the optical element shown in FIG. 1A taken along the line A-A. An optical element 10 shown in FIG. 1 includes: an optical crystal 1; and a coating film 2 coating the surfaces of the optical crystal 1. In the optical element 10, the coating film 2 is coated on all the surfaces of the optical crystal 1. However, the present invention is not limited to this configuration, and the coating film 2 may he formed, for example, at least on one surface of the optical crystal 1, or on two opposing surfaces of the optical crystal 1 in a direction of incident light.

Second Embodiment

<Optical Element>

An optical element according to a second embodiment will now be described. It is noted that the description of matters common to the first embodiment described above is omitted.

The optical element according to the present embodiment includes: an optical crystal; and a coating film coating the surface of the optical crystal; and an absolute value of the diffrence in linear expansion coefficient between the coating film and the optical crystal is 130 ppm/K or less. By this arrangement, a stress caused by the difference in linear expansion coefficient between the coating film and the optical crystal is reduced, as a result of which the coating film is less susceptible to rupture, and the occurrence of cracks in the coating film is prevented.

The absolute value of the difference in linear expansion coefficient between the coating film and the optical crystal is preferably from 0 ppm/K to 120 ppm/K, more preferably from 0 ppm/K to 100 ppm/K, and still more preferably from 0 ppm/K to 50 ppm/K.

The coating film is not particularly limited as long as the absolute value of the difference in linear expansion coefficient between the coating film and the optical crystal satisfies the above described condition, and the coating film may be one containing the above described organic compound or one containing an inorganic compound. Further, the coating film is preferably one consisting of the organic compound, from the viewpoint of simplifying an apparatus for film formation and reducing the production cost.

Further, the coating film may have a linear expansion coefficient of 100 ppm/K or less, from 10 ppm/K to 100 ppm/K, or from 50 ppm/K to 100 ppm/K, from the viewpoint of reducing the difference in linear expansion coefficient between the coating film and the optical crystal, and thereby suitably preventing the occurrence of cracks.

Third Embodiment

<Optical Element>

An optical element according to a third embodiment will now be described. It is noted that the description of matters common to the first embodiment or the second embodiment described above is omitted.

The optical element according to the present embodiment includes: an optical crystal; and a coating film coating the surface of the optical crystal; and the coating film has a Young's modulus at 25° C. of 10 GPa or less. By this arrangement, the coating film exhibits a moderate viscoelasticity and thus has flexibility, as a result of which the coating film is less susceptible to rupture, and the occurrence of cracks in the coating film is prevented.

The coating film is not particularly limited as long as the Young's modulus at 25° C. satisfies the above described condition, and the coating film may be one containing the above described organic compound or one containing an inorganic compound. Further, the coating film is preferably one consisting of the organic compound, from the viewpoint of simplifying an apparatus for film formation and reducing the production cost. The coating film preferably has a Youngs modulus at 25° C. of 5 GPa or less, and more preferably 3 GPa or less.

<Method of Producing Optical Element>

The method of producing the optical element according to any one of the first embodiment to the third embodiment includes the step of forming the coating film on the surface of the optical crystal, by a wet process.

Examples of the vet process include: spray coating, spin coating, blade coating, dip coating, cast coating, roll coating, bar coating, die coating, and ink-jet coating. Among these, dip coating is preferred since it allows for forming the coating film coating the surface of the optical crystal by a simple method.

In the step of forming the coating film by the wet process, it is preferred that the coating film is formed on the surface of the optical crystal, by dipping the optical crystal in a liquid containing a material for forming the coating film, and pulling up the dipped optical crystal from the liquid. The film thickness of the coating film can be adjusted as appropriate, by controlling the concentration of the material for forming the coating film in the liquid, the period of time for dipping the optical crystal into the liquid, the speed of pulling up the optical crystal from the liquid, and the like.

For example, the concentration of the material for forming the coating film in the liquid may be within the range of from 1% by mass to 10% by mass, or from 3% by mass to 8% by mass. The liquid containing the material for forming the coating film may be prepared by, for example, dissolving or dispersing the material for forming the coating film in a solvent. As the solvent, a solvent which is capable of, for example, dissolving or dispersing the material for forming the coating film, may be selected as appropriate.

Further, the material for forming the coating film is preferably the organic compound described above, more preferably a material containing a cyclic structure within the molecular structure, and still more preferably an organic compound containing, as a structural unit, at least one compound selected from the group consisting of: a compound containing a cyclic structure to which a fluorine atom is bound; and a compound containing a cyclic olefin structure.

The optical element according to any one of the first embodiment to the third embodiment is not limited to an optical element produced by a wet process, and may he an optical element produced by a dry process. Further, the coating film need not be formed on all the surfaces of the optical crystal, and may be formed at least on one surface of the optical crystal, or on two opposing surfaces of the optical crystal in the direction of incident light. It is suitable to use an optical crystal for use in the infrared to millimeter wave band, because such a crystal allows for a sufficient control of the film thickness of the coating film to be formed thereon, even when the film formation is carried out by a wet process.

EXAMPLES

Next, one embodiment of the present invention will be described by way of the following Examples. However, the invention is in no way limited by Examples.

Example 1

<Formation of Coating Film>

A coating film consisting of an organic compound was formed on the surfaces of a DAST crystal (thickness: 0.86 mm), which is an organic nonlinear optical crystal, by a dip coating method as described below. First, in an environment of normal pressure and room temperature, a fluorine resin, CYTOP (manufactured by AGC Chemicals), which is an organic compound, was dissolved in a fluorine-based liquid, NOVEC (manufactured by 3M Company), to prepare a 5% by mass CYTOP solution. The DAST crystal was dipped in the thus prepared CYTOP solution, and the DAST crystal was then pulled up at a speed of 60 mm/min, to form a CYTOP monolayer film having a thickness of about 300 nm on all the surfaces of the DAST crystal. In the above described manner, an optical element including the coating film consisting of the organic compound and formed on the surfaces of the DAST crystal, was obtained.

The DAST crystal has a linear expansion coefficient of 153 ppm/K, the CYTOP monolayer film has a linear expansion coefficient of 74 ppm/K, the absolute value of the difference in linear expansion coefficient between the CYTOP monolayer film and the DAST crystal is 79 ppm/K, and the Young's modulus at 25° C. of the CYTOP monolayer film is 1.5 GPa. CYTOP contains a cyclic structure to which a fluorine atom is bound.

Comparative Example 1

<Formation of Coating Film>

A coating film consisting of an inorganic compound was formed on the surface of a DAST crystal (thickness: 1.89 mm), which is an organic nonlinear optical crystal, by a vacuum vapor deposition method as described below. First, $SiO_2$ was placed in apparatus for film formation, and the DAST crystal was set at a position above the thus placed $SiO_2$. Thereafter, an electron beam was irradiated to the placed $SiO_2$ using an electron gun, so that a portion of the $SiO_2$ was evaporated and the evaporated $SiO_2$ was vapor-deposited to the DAST crystal, to form an $SiO_2$ monolayer film having a thickness of about 300 nm on one surface of the DAST crystal. In the above described manner, an optical element including the coating film consisting of $SiO_2$ and formed on the surface of the DAST crystal, was obtained.

The $SiO_2$ monolayer film has a linear expansion coefficient of from 0.5 ppm/K to 0.6 ppm/K, the absolute value of the difference in linear expansion coefficient between the $SiO_2$ monolayer film and the DAST crystal is about 152.5 ppm/K, and the Young's modulus at 25° C. of the $SiO_2$ monolayer film is from 72 GPa to 74 GPa.

<Observation of Change Over Time of Coating Film>

Figure 2A:
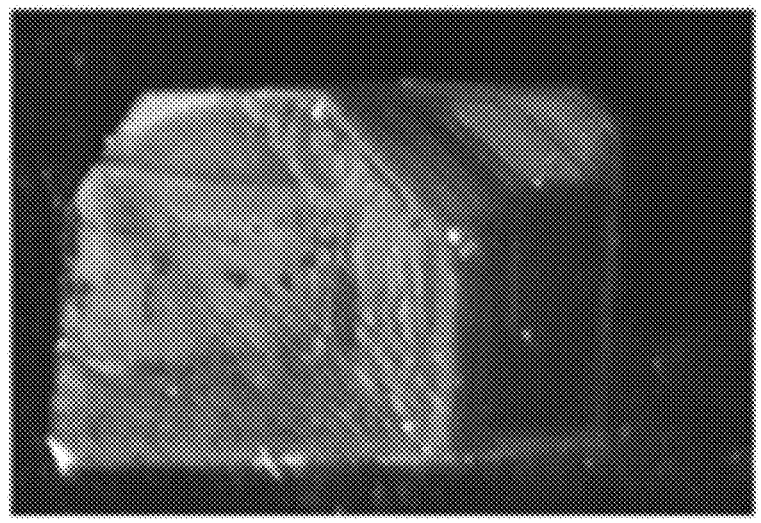
FIG. 2A is a photograph showing the surfaces of an optical crystal before forming a CYTOP monolayer film thereon in Example 1.
Figure 2B:
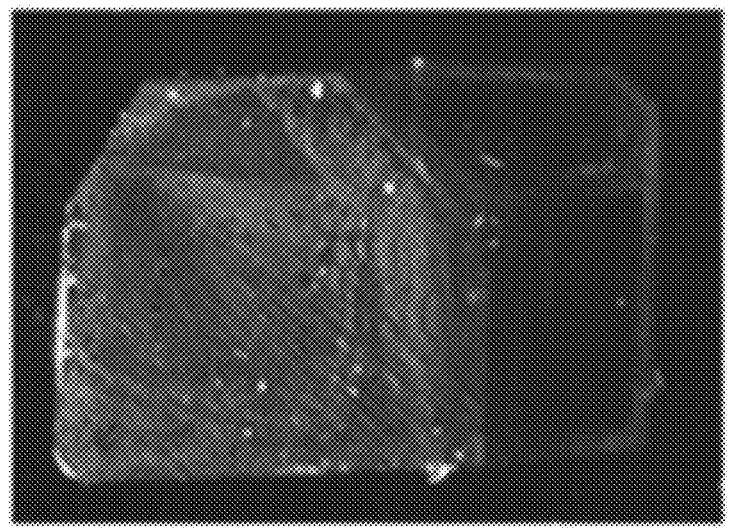
FIG. 2B is a photograph showing the surfaces of an optical element 90 days after the formation of the CYTOP monolayer film in Example 1.
Figure 2C:
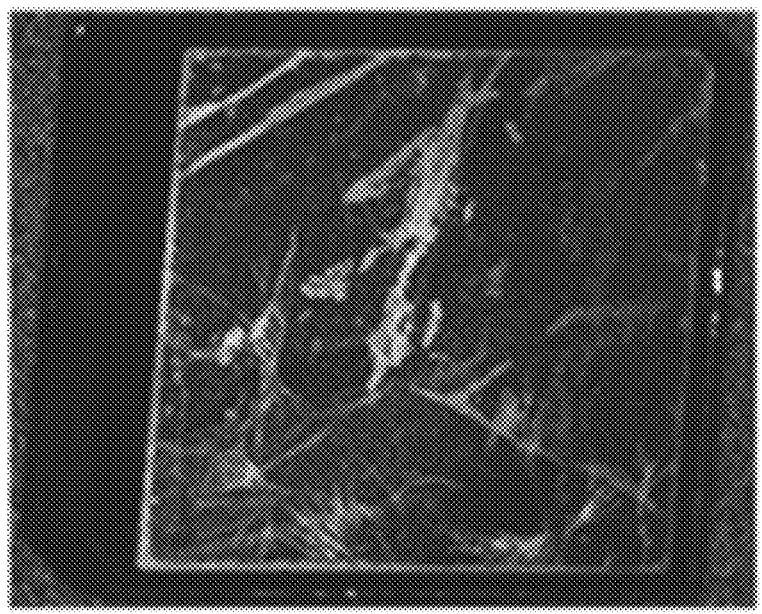
FIG. 2C is a photograph showing the surface of an optical crystal before forming an $SiO_2$ monolayer film thereon in Comparative Example 1.
Figure 2D:
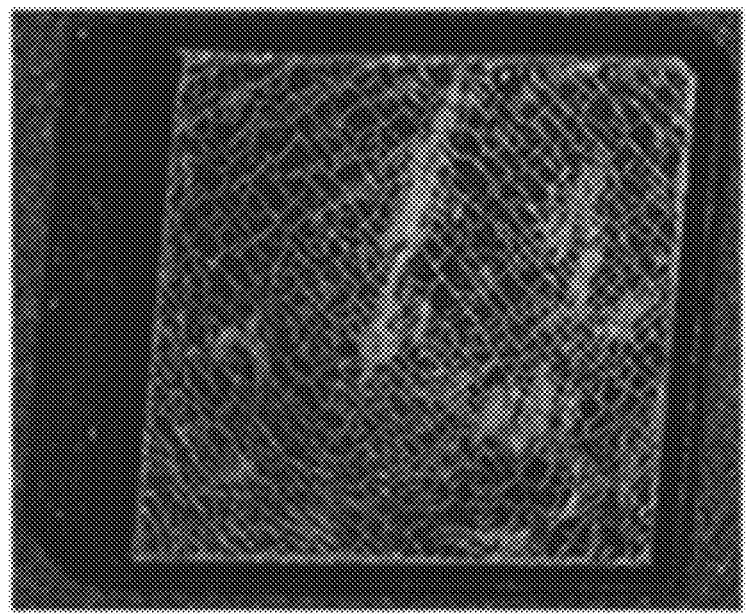
FIG. 2D is a photograph showing the surface of an optical element 7 days after the formation of the $SiO_2$ monolayer film in Comparative Example 1.

The change over time of each of the coating films of Example 1 and Comparative Example 1 was observed. The results are shown in FIG. 2. FIG. 2A is a photograph showing the surfaces of the optical crystal before forming the CYTOP monolayer film thereon in Example 1; FIG. 2B is a photograph showing the surfaces of the optical element 90 days after the formation of the CYTOP monolayer film in Example 1; FIG. 2C is a photograph showing the surface of the optical crystal before forming the $SiO_2$ monolayer film thereon in Comparative Example 1; and FIG. 2D is a photograph showing the surface of the optical element 7 days after the formation of the $SiO_2$ monolayer film in Comparative Example 1.

As shown in FIG. 2B, in the optical element of Example 1, no major change was observed in the state of the coating film, even 90 days after the formation of the coating film, revealing that the occurrence of cracks in the coating film was prevented. In the optical element of Comparative Example 1. in contrast, the occurrence of cracks was observed in the coating film about 7 days after the formation of the coating film, as shown in FIG. 2D. Although cracks occurred immediately after the formation of the coating film in the optical element of Comparative Example 1, an increased number of cracks were observed after the lapse of 7 days.

<Confirmation of Antireflection Effect>

The antireflection effect of each of the coating films of Example 1 and Comparative Example 1 was confirmed by comparing the transmittance as measured by a solid spectrophotometer, between the two films. First, the respective optical elements were prepared as described in Example 1 and Comparative Example 1. In the preparation of the optical elements, a DAST crystal having a thickness of 0.86 mm was used in Example 1, and a DAST crystal having a thickness of 1.89 mm was used in Comparative Example 1.

Figure 3A:
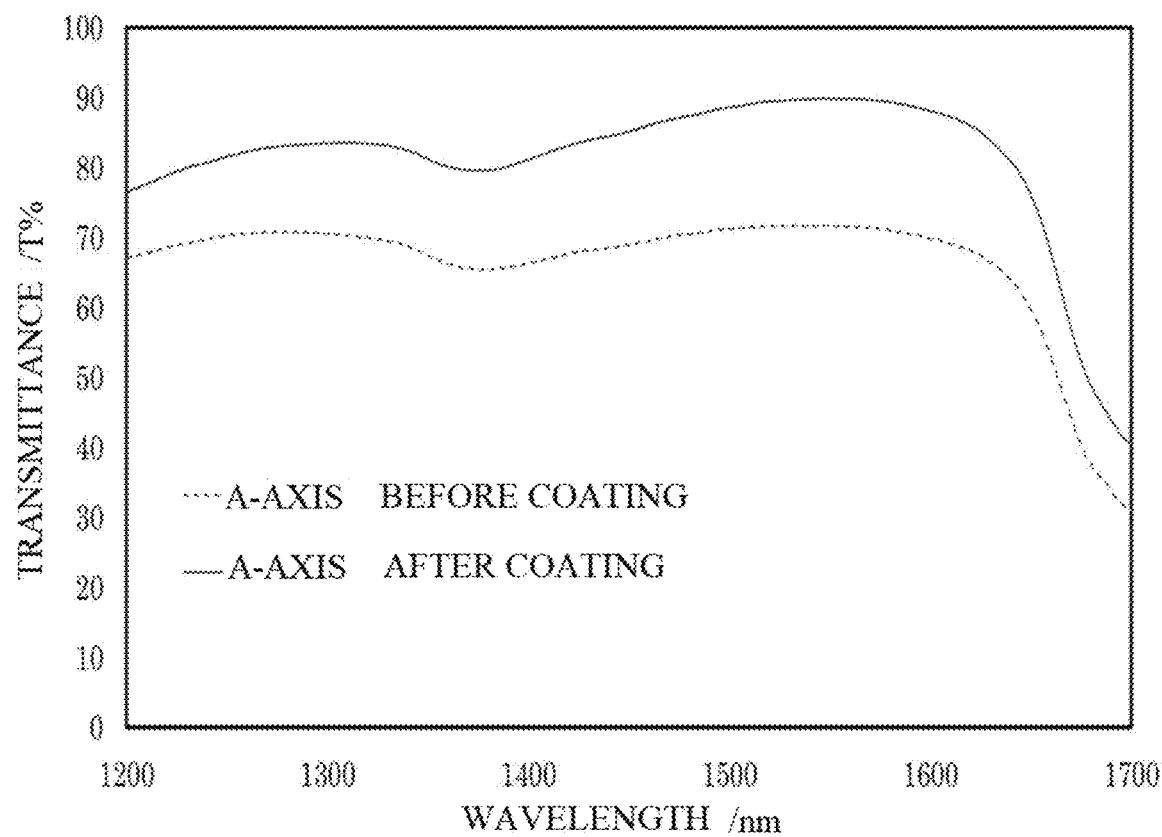
FIG. 3A is a graph showing measurement results of transmittance before coating the coating film and after coating the coating film in Example 1.
Figure 3B:
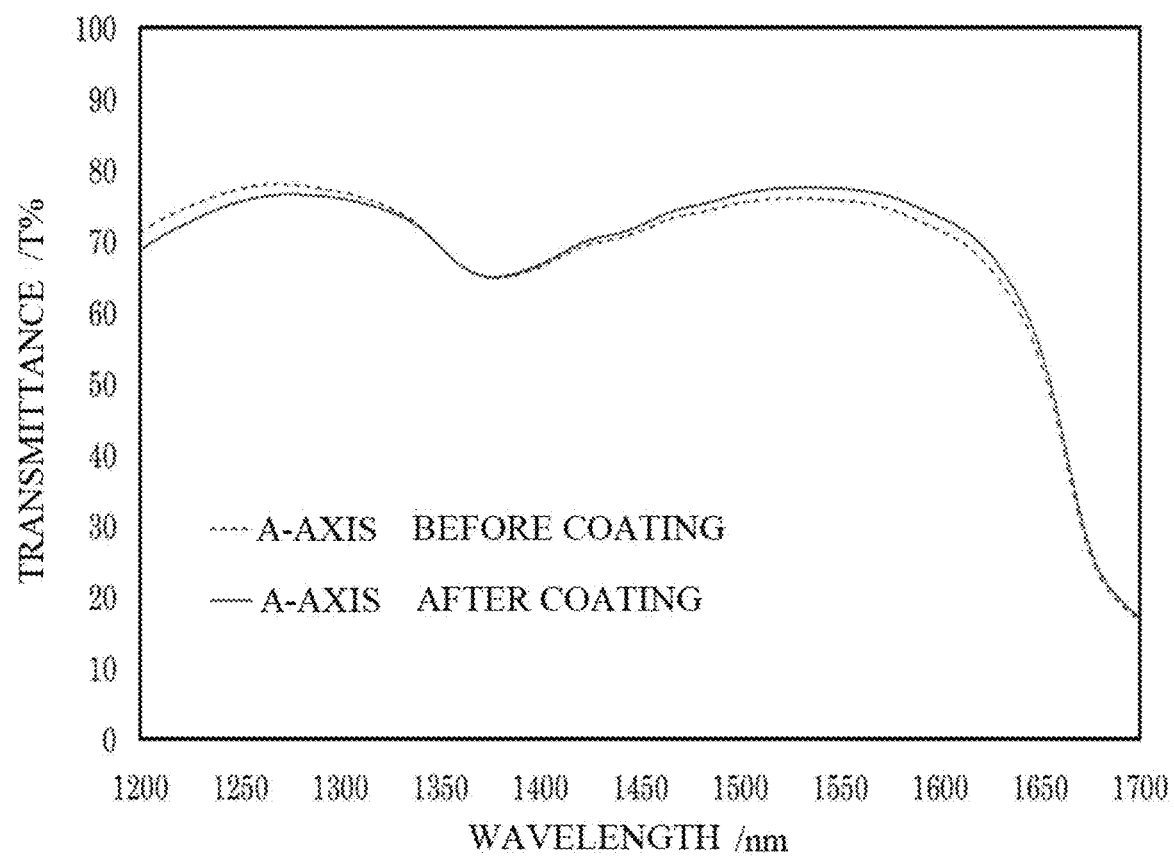
FIG. 3B is a graph showing measurement results of transmittance before coating the coating film and after coating the coating film in Comparative Example 1.

Next, the measurement of the transmittance was carried out using a solid spectrophotometer, SOLIDSPEC-3700 DUV (manufactured by Shimadzu Corporation at a measurement wavelength of from 1,200 nm to 1,700 nm. In the measurement, a polarizer was disposed between a light source and the optical element to be measured, in such a manner that the a-axis of the DAST crystal coincides with the direction of polarization. The results are shown in FIG. 3 and Table 1. FIG. 3A is a graph showing the measurement results of the transmittance before coating the coating film and after coating the coating film in Example 1; and FIG. 3B is a graph showing the measurement results of the transmittance before coating the coating film and after coating the coating film in Comparative Example 1. Table 1 shows the values of the transmittance of each of the optical elements measured at a wavelength of 1,550 nm, and the rate of an increase in the transmittance after the coating, relative to the transmittance before the coating.

TABLE 1

| | Transmittance (a-axis) | | |
|---|---|---|---|
| | Before Coating | After Coating | Rate of Increase |
| Example 1 | 71.723 | 89.848 | 18.13 |
| Comparative Example 1 | 75.741 | 77.408 | 1.667 |

As shown in FIG. 3 and Table 1, the optical element of Example 1 exhibited a higher transmittance as compared to that of the optical element of Comparative Example 1. Further, in the optical element of Example 1, the rate of the increase in the transmittance in the a-axial direction of the DAST crystal, as measured at 1,550 nm, was 18.13 (89.848-71.723)%. In the optical element of Comparative Example 1, in contrast, the rate of the increase in the transmittance in the a-axial direction of the DAST crystal, as measured at 1,550 nm, was 1.667 (77.408-75.741%. In the optical element of Comparative Example 1, the transmittance in the a-axial direction was barely increased, revealing that the $SiO_2$ monolayer film was not functional as an antireflection film. In contrast, the coating film of the optical element of Example 1 exhibited an improved effect as an antireflection film, as compared to that of Comparative Example 1. Further, a theoretical value of the transmittance, in the case of forming the coating film of CYTOP on two opposing surfaces of the DAST crystal in the direction of incident light, which is calculated using the refractive index of each layer, is 92.5%, and the optical element of Example 1 exhibited a value close to the theoretical value of the transmittance. This confirms a marked effect of the optical element of Example 1.

DESCRIPTION OF SYMBOLS 1 optical crystal
2 coating film
10 optical element

What is claimed is:

1. An optical element comprising:
   an optical crystal; and
   an antireflection film coating a surface of the optical crystal;
   wherein the antireflection film contains a fluorinated amorphous polymer that has a cyclic structure to which a fluorine atom is bound and a compound containing a cyclic olefin structure; and
   wherein the optical crystal is a 4-dimethylamino-N-methyl-4-stilbazolium tosylate (DAST) crystal.

2. The optical element according to claim 1, wherein an absolute value of a difference in linear expansion coefficient between the antireflection film and the optical crystal is 130 ppm/K or less.

3. The optical element according to claim 1, wherein the antireflection film has a Young's modulus at 25° C. of 10 GPa or less.

4. The optical element according to claim 1, wherein the antireflection film has a refractive index of from 1.3 to 2.0 in at least a part of a wavelength range of from 1,000 nm to 2,000 nm.

5. The optical element according to claim 1, wherein the antireflection film has a refractive index of from 1.3 to 2.0 in at least a part of a frequency range of from 0.3 THz to 30 THz.

6. The optical element according to claim 2, wherein the antireflection film has a Young's modulus at 25° C. of 10 GPa or less.

7. The optical element according to claim 2, wherein the antireflection film has a refractive index of from 1.3 to 2.0 in at least a part of a wavelength range of from 1,000 nm to 2,000 nm.

8. The optical element according to claim 3, wherein the antireflection film has a refractive index of from 1.3 to 2.0 in at least a part of a wavelength range of from 1,000 nm to 2,000 nm.

9. A method of producing the optical element according to claim 1,
   wherein the method comprises a step of forming the antireflection film on the surface of the optical crystal, by a wet process.

10. The method of producing the optical element, according to claim 9, wherein, in the step of forming the antireflection film by the wet process, the antireflection film is formed on the surface of the optical crystal, by dipping the optical crystal in a liquid containing a material for forming the antireflection film, and pulling up the dipped optical crystal from the liquid.

* * * * *